(12) United States Patent
Jeon et al.

(10) Patent No.: US 10,593,711 B2
(45) Date of Patent: Mar. 17, 2020

(54) METHOD OF MANUFACTURING OLED DISPLAY INCLUDING THIN FILM TRANSISTOR HAVING BOTH SOURCE AND DRAIN FORMED OVER AND PATTERNED TOGETHER WITH SEMICONDUCTOR LAYER

(71) Applicant: SAMSUNG DISPLAY CO., LTD., Yongin-si, Gyeonggi-Do (KR)

(72) Inventors: Joohee Jeon, Yongin-si (KR); Chaungi Choi, Yongin-si (KR); Youngsik Yoon, Yongin-si (KR); Seungho Jung, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 22 days.

(21) Appl. No.: 16/103,435

(22) Filed: Aug. 14, 2018

(65) Prior Publication Data
US 2018/0374879 A1 Dec. 27, 2018

Related U.S. Application Data

(62) Division of application No. 14/697,018, filed on Apr. 27, 2015, now Pat. No. 10,074,676.

(30) Foreign Application Priority Data

Nov. 7, 2014 (KR) .......................... 10-2014-0154729

(51) Int. Cl.
*H01L 29/08* (2006.01)
*H01L 27/12* (2006.01)
*H01L 29/417* (2006.01)

(52) U.S. Cl.
CPC ...... *H01L 27/1288* (2013.01); *H01L 27/1255* (2013.01); *H01L 29/41733* (2013.01)

(58) Field of Classification Search
CPC ............. H01L 27/1255; H01L 27/1288; H01L 29/41733
See application file for complete search history.

(56) References Cited

U.S. PATENT DOCUMENTS

2006/0262052 A1* 11/2006 Kim .................... H01L 27/3246 345/76
2010/0270538 A1* 10/2010 Kang .................... H01L 27/326 257/40

(Continued)

FOREIGN PATENT DOCUMENTS

KR 10-2006-0118825 A 11/2006
KR 10-2009-0120698 A 11/2009

(Continued)

*Primary Examiner* — Matthew E. Gordon (57) ABSTRACT

A TFT array substrate, OLED display including the same, and a manufacturing method of the OLED display are disclosed. In one aspect, the TFT array substrate includes a substrate and a TFT formed over the substrate. The TFT includes an active layer, a gate electrode, a source electrode, a drain electrode, a first insulating layer interposed between the gate electrode and the source and drain electrodes. Each of the source and drain electrodes is interposed between the active layer and the first insulating layer. The TFT array substrate also includes a capacitor formed over the substrate and having lower and upper electrodes and a pixel electrode electrically connected to the TFT.

10 Claims, 7 Drawing Sheets

(56) References Cited

U.S. PATENT DOCUMENTS

| | | | |
|---|---|---|---|
| 2012/0104397 A1* | 5/2012 | Choi | H01L 27/1255 257/59 |
| 2013/0009209 A1* | 1/2013 | Yamazaki | H01L 27/1225 257/192 |
| 2013/0020571 A1* | 1/2013 | Yamazaki | H01L 29/78618 257/43 |
| 2013/0049118 A1* | 2/2013 | Katsuhara | H01L 51/105 257/347 |
| 2013/0075722 A1* | 3/2013 | Yamazaki | H01L 29/41733 257/43 |
| 2016/0133679 A1 | 5/2016 | Jeon et al. | |

FOREIGN PATENT DOCUMENTS

| | | |
|---|---|---|
| KR | 10-2010-0116876 A | 11/2010 |
| KR | 10-2012-0044627 A | 5/2012 |

* cited by examiner

METHOD OF MANUFACTURING OLED DISPLAY INCLUDING THIN FILM TRANSISTOR HAVING BOTH SOURCE AND DRAIN FORMED OVER AND PATTERNED TOGETHER WITH SEMICONDUCTOR LAYER

RELATED APPLICATION

This application is a divisional of U.S. application Ser. No. 14/697,018, filed on Apr. 27, 2015, which claims priority under 35 U.S.C. § 119 to Korean Patent Application No. 10-2014-0154729, filed on Nov. 07, 2014, in the Korean Intellectual Property Office, the disclosures of which are incorporated by reference herein in their entireties.

BACKGROUND

Field

The described technology generally relates to a thin film transistor (TFT) array substrate, an organic light-emitting diode (OLED) display including the TFT array substrate, and a method of manufacturing the OLED display.

Description of the Related Technology

OLED displays have drawn attentions for use as next generation displays for their wide viewing angles, excellent contrast, and high response rates.

Flat panel display technologies, such as OLED displays and liquid crystal displays (LCDs), include a matrix of pixels, each having a thin film transistor (TFT), a capacitor, and wirings connecting the TFT and the capacitor. On a substrate on which the FPD is formed, the TFT, the capacitor, and the wirings are formed in fine patterns, and a photolithography process, which transfers patterns by using a mask, is mainly used in order to form the fine patterns of the substrate.

In the photolithography process, a photoresist is spread on a substrate on which patterns are to be formed, and the photoresist is exposed to light by using an exposure device, such as a stepper. Then, a development process is performed on the light-sensitive (positive) photoresist. After the photoresist is developed, patterns on the substrate are etched by using the remaining photoresist, and a sacrificial photoresist material is removed after the patterns are formed.

SUMMARY OF CERTAIN INVENTIVE ASPECTS

One inventive aspect is a thin film transistor (TFT) array substrate whose manufacturing process is simple and signal transferring characteristics are excellent, an OLED display including the TFT array substrate, and a method of manufacturing the OLED display.

Another aspect is a thin film transistor (TFT) array substrate that includes a substrate; a TFT formed on the substrate and including an active layer, a gate electrode, a source electrode, and a drain electrode, wherein a first insulating layer is interposed between the gate electrode, and the source electrode and the drain electrode, and the source electrode and the drain electrode are interposed between the active layer and the first insulating layer; a capacitor formed on the substrate and including a lower electrode and an upper electrode; and a pixel electrode electrically connected to the TFT.

The lower electrode of the capacitor can include a same material as that of the source electrode and the drain electrode and can be formed on a same layer as the source electrode and the drain electrode. The upper electrode of the capacitor can be formed on a same layer as the gate electrode and can include a same material as the gate electrode.

At least a portion of the active layer can overlap the source electrode, the drain electrode, and the gate electrode. The active layer can include a first region which is an area overlapping the source electrode and the drain electrode, a second region which is an area overlapping the gate electrode, and a third region which is an area except the first region and the second region, wherein only the third region includes an impurity.

The first region can be an area in which the active layer directly contacts the source electrode and the drain electrode.

The first insulating layer can be formed such that the first insulating layer covers the active layer, and the source electrode and the drain electrode.

The gate electrode can be formed on the first insulating layer, and the first insulating layer can be interposed between the gate electrode, and the source electrode and the drain electrode.

The active layer, the source electrode, and the drain electrode can be integrally formed.

The TFT array substrate can further include a second insulating layer which is formed on the TFT and the capacitor to cover the gate electrode and the upper electrode.

Another aspect is an OLED display that includes: a substrate; a thin film transistor (TFT) formed on the substrate and including an active layer, a gate electrode, a source electrode, and a drain electrode, wherein a first insulating layer is interposed between the gate electrode, and the source electrode and the drain electrode, and the source electrode and the drain electrode are interposed between the active layer and the first insulating layer; a capacitor formed on the substrate and including a lower electrode formed on a same layer as the source electrode and the drain electrode and an upper electrode formed on a same layer as the gate electrode; a second insulating layer formed on the TFT and the capacitor to cover the gate electrode and the upper electrode; a pixel electrode electrically connected with the TFT; a third insulating layer exposing a central portion of the pixel electrode and covering an edge of the pixel electrode; an intermediate layer formed on the pixel electrode and including an emission layer; and an opposite electrode covering the intermediate layer and formed to face the pixel electrode.

Another aspect is a method of manufacturing an OLED display that includes: a first mask process for forming an active layer, a source electrode, and a drain electrode of a thin film transistor (TFT) by sequentially disposing a semiconductor material layer and a first metal layer on a substrate and patterning the semiconductor material layer and the first metal layer; a second mask process for forming a gate electrode on a portion of a first insulating layer, which corresponds to the active layer, after stacking the first insulating layer and a second metal layer on the active layer, the source electrode, and the drain electrode so as to cover the active layer, the source electrode, and the drain electrode; a third mask process for forming a via-hole exposing any one of the source electrode and the drain electrode of the TFT, after stacking a second insulating layer on the first insulating layer to cover the gate electrode; a fourth mask process for forming a pixel electrode electrically connected with any one of the source electrode and the drain electrode of the TFT via the via-hole, by disposing a third metal layer on the second insulating layer; and a fifth mask process for forming a third insulating layer on the second insulating layer, the third insulating layer exposing a central portion of the pixel electrode by covering an edge of the pixel electrode.

The first mask process can further include forming a lower electrode of a capacitor, on the substrate.

In the first mask process, the lower electrode of the capacitor can be formed on a same layer as the source electrode and the drain electrode of the TFT, at a same time as the source electrode and the drain electrode of the TFT.

The second mask process can further include forming an upper electrode on the lower electrode of the capacitor.

In the second mask process, the upper electrode of the capacitor can be formed on a same layer as the gate electrode of the TFT, at a same time as the gate electrode of the TFT.

The first mask process can be performed by using a half-tone mask.

The active layer, the source electrode, and the drain electrode of the TFT can be integrally formed.

At least a portion of the active layer can overlap the source electrode, the drain electrode, and the gate electrode. The active layer can include a first region which is an area overlapping the source electrode and the drain electrode, a second region which is an area overlapping the gate electrode, and a third region which is an area except the first region and the second region, wherein the first region is formed such that the active layer directly contacts the source electrode and the drain electrode.

The method can further include, between the second mask process and the third mask process, disposing impurities only in the third region of the active layer.

Another aspect is a thin film transistor (TFT) array substrate for a display device, the TFT array substrate comprising a substrate and a TFT formed over the substrate and comprising an active layer, a gate electrode, a source electrode, a drain electrode, a first insulating layer interposed between the gate electrode and the source and drain electrodes, wherein each of the source and drain electrodes is interposed between the active layer and the first insulating layer. The TFT array substrate also comprises a capacitor formed over the substrate and having lower and upper electrodes and a pixel electrode electrically connected to the TFT.

In the above array substrate, the lower electrode of the capacitor is formed of the same material as that of the source and drain electrodes and formed on the same layer as the source and drain electrodes, wherein the upper electrode of the capacitor is formed on the same layer as the gate electrode and formed of the same material as that of the gate electrode.

In the above array substrate, the active layer has a first region at least partially overlapping the source and drain electrodes, a second region at least partially overlapping the gate electrode, and a third region different from the first and second regions, wherein only the third region includes doped impurities.

In the above array substrate, the first region includes an area in which the active layer directly contacts the source and drain electrodes.

In the above array substrate, the first insulating layer covers the active layer, the source electrode and the drain electrode.

In the above array substrate, the gate electrode is formed over the first insulating layer.

In the above array substrate, the active layer, the source electrode, and the drain electrode are integrally formed.

The TFT array substrate further comprises a second insulating layer which is formed over the TFT and the capacitor so as to cover the gate electrode and the upper electrode of the capacitor.

Another aspect is an organic light-emitting diode (OLED) display comprising a substrate and a thin film transistor (TFT) formed over the substrate and comprising an active layer, a gate electrode, a source electrode, a drain electrode, a first insulating layer interposed between the gate electrode and the source and drain electrodes, wherein each of the source and drain electrodes are interposed between the active layer and the first insulating layer. The OLED display also comprises a capacitor formed over the substrate and comprising a lower electrode formed on the same layer as the source and drain electrodes and an upper electrode formed on the same layer as the gate electrode. The OLED display also comprises a second insulating layer formed over the TFT and the capacitor so as to cover the gate electrode and the upper electrode. The OLED display also comprises a pixel electrode electrically connected to the TFT, a third insulating layer exposing a central portion of the pixel electrode and covering an edge of the pixel electrode, an intermediate layer formed over the pixel electrode and comprising an emission layer, and an opposite electrode covering the intermediate layer and facing the pixel electrode.

In the above display, the active layer has a first region at least partially overlapping the source and drain electrodes, a second region at least partially overlapping the gate electrode, and a third region different from the first and second regions, wherein only the third region includes doped impurities.

Another aspect is a method of manufacturing an organic light-emitting diode (OLED) display, the method comprising first forming a semiconductor material layer and a first metal layer over a substrate, wherein the first metal layer is formed over the semiconductor material layer. The method also includes first patterning the semiconductor material layer and the first metal layer so as to form an active layer, a source electrode, and a drain electrode of a thin film transistor (TFT). The method also includes second forming a first insulating layer including a portion corresponding to the active layer and third forming a second metal layer over the active layer, the source electrode and the drain electrode. The method also includes second patterning the second metal layer so as to form a gate electrode on the portion of the first insulating layer and fourth forming a second insulating layer, having a via hole, over the first insulating layer so as to cover the gate electrode, wherein the via hole exposes one of the source and drain electrodes. The method also includes fifth forming a third metal layer over the second insulating layer, third patterning the third metal layer so as to form a pixel electrode electrically connected to one of the source and drain electrodes through the via hole, and sixth forming a third insulating layer over the second insulating layer so as to cover edges of the pixel electrode and expose the remaining portion of the pixel electrode.

In the above method, the first forming and the first patterning are performed with a first mask, wherein the second forming, the third forming and second patterning are performed with a second mask, wherein the fourth forming is performed with a third mask, wherein the fifth forming and the fifth patterning are performed with a fourth mask, and wherein the sixth forming is performed with a fifth mask.

In the above method, the first forming comprises forming a lower electrode of a capacitor over the substrate.

In the above method, in the first forming, the lower electrode of the capacitor is formed on the same layer as the source and drain electrodes, and formed substantially simultaneously as the source and drain electrodes.

In the above method, the second forming further comprises forming an upper electrode of the capacitor over the lower electrode.

In the above method, in the second forming, the upper electrode of the capacitor is formed on the same layer as that of the gate electrode and formed substantially simultaneously as the gate electrode.

In the above method, the first forming is performed with a half-tone mask.

In the above method, the active layer, the source electrode, and the drain electrode are integrally formed.

In the above method, the active layer has a first region at least partially overlapping the source and drain electrodes, a second region at least partially overlapping the gate electrode, and a third region different from the first and second regions, wherein the first region is formed such that the active layer directly contacts the source and drain electrodes.

The above method further comprises, between the third forming and the fourth forming, forming impurities only in the third region of the active layer.

DETAILED DESCRIPTION OF CERTAIN INVENTIVE EMBODIMENTS

In manufacturing OLED displays using photolithography, masks for patterning have to be prepared. Thus, mask manufacturing costs increase as more masks are used. Also, the patterning process can be very complicated, which also leads to increased manufacturing time and costs.

Reference will now be made in detail to exemplary embodiments, examples of which are illustrated in the accompanying drawings, wherein like reference numerals refer to like elements throughout, In this regard, the present exemplary embodiments can have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items.

It will be understood that although the terms "first," "second," etc. can be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and can be interpreted in a broader sense. For example, the x-axis, the y-axis, and the z-axis can be perpendicular to one another, or can represent different directions that are not perpendicular to one another.

When a certain embodiment can be implemented differently, a specific process order can be performed differently from the described order. For example, two consecutively described processes can be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
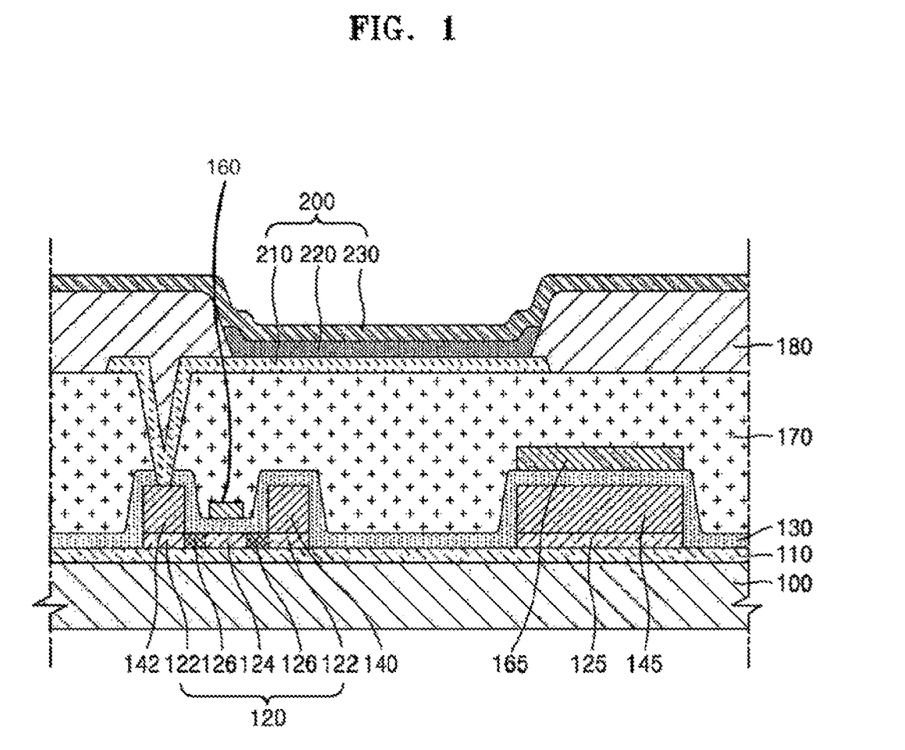
FIG. 1 is a cross-sectional view of an OLED display including a thin film transistor (TFT) array substrate, according to an embodiment.

FIG. 1 is a cross-sectional view of an OLED display including a thin film transistor (TFT) array substrate, according to an embodiment.

Referring to FIG. 1, the OLED display according to the present embodiment includes a substrate 100, a TFT formed on the substrate 100, a capacitor (CAP) including a lower electrode 145 and an upper electrode 165, and a pixel electrode 210 electrically connected with the TFT.

The substrate 100 can be formed of various materials, such as a glass material, a metal material, or a plastic material, such as polyethylen terephthalate (PET), polyethylen naphthalate (PEN), and polyimide. The substrate 100 can have a display region in which a plurality of pixels are formed and an ambient or non-display region which surrounds the display region.

Devices, such as the TFT and the CAP, can be formed on the substrate 100. In addition, an OLED 200 electrically connected to the TFT can be formed on the substrate 100. The pixel electrode 210 is electrically connected to the TFT.

The TFT includes an active layer 120 formed of amorphous silicon, polycrystalline silicon, or an organic semiconductor material, a source electrode 140, a drain electrode 142, and a gate electrode 160.

A buffer layer 110 formed of silicon oxide ($SiO_2$) or silicon nitride ($SiN_x$) can be formed on the substrate 100 to planarize a surface of the substrate 100 or to prevent impurities from penetrating into the active layer 120, and the active layer 120 can be formed on the buffer layer 110.

The source electrode 140 and the drain electrode 142 can be formed on the active layer 120. The source electrode 140 and the drain electrode 142 directly contact a portion of the active layer 120 to be electrically connected with the active layer 120. That is, there is no insulating layer between the source electrode 140 and the drain electrode 142, and the active layer 120, and thus, the source electrode 140 and the drain electrode 142 are not electrically connected with the active layer 120 via a contact hole formed in the insulating layer. The source electrode 140 and the drain electrode 142 directly contact the active layer 120 to be integrally formed with the active layer 120. In order for the source and drain electrodes 140 and 142 to have conductivity, the source and drain electrodes 140 and 142 can be formed of at least one material selected from, for example, Al, Pt, Pd, Ag, Mg, Au, Ni, Nd, Ir, Cr, Li, Ca, Mo, Ti, W, and Cu, as a single layer or multiple layers.

The gate electrode 160 is formed above the active layer 120. The source electrode 140 and the drain electrode 142 are electrically connected to each other according to a signal applied to the gate electrode 160. Considering adhesion to an adjacent layer, surface flatness of a stacked layer, and processability, the gate electrode 160 can be formed of at least one material selected from, for example, Al, Pt, Pd, Ag, Mg, Au, Ni, Nd, Ir, Cr, Li, Ca, Mo, Ti, W, and Cu, as a single layer or multiple layers.

Here, in order to secure insulation between the active layer 120 and the gate electrode 160, a first insulating layer 130, which is a gate insulating layer formed of silicon oxide ($SiO_2$) and/or silicon nitride ($SiN_x$), can be interposed between the active layer 120 and the gate electrode 160. The first insulating layer 130 can also be interposed between the gate electrode 160, and the source and drain electrodes 140 and 142. The source and drain electrodes 140 and 142 are formed between the active layer 120 and the first insulating layer 130. As illustrated in FIG. 1, the first insulating layer 130 can be formed to cover not only the active layer 120 but also the source and drain electrodes 140 and 142, and the gate electrode 160 can be formed on the first insulating layer 130.

Meanwhile, as described above, the source electrode 140, the drain electrode 142, and the gate electrode 160 can be formed on the active layer 120, and thus, at least a portion of the active layer 120 overlaps the source electrode 140, the drain electrode 142, and the gate electrode 160. Here, the active layer 120 can have a first region 122 which is an area overlapping the source and drain electrodes 140 and 142, a second region 124 which is an area overlapping the gate electrode 160, and a third region 126 which is an area except the first and second regions 122 and 124. Here, the first region 122 can be the region in which the active layer 120 overlaps and directly contacts the source and drain electrodes 140 and 142.

The active layer 120 includes an impurity region doped with impurities and a channel region not doped with impurities. In some embodiments, only the third region 126 is doped with impurities, and thus, the third region 126 can be the impurity region. Accordingly, in some embodiments, the first region 122 does not include impurities. Likewise, the second region 124 corresponding to a portion of the active layer 120, can be understood as the channel region, and can have a semiconductor characteristic.

Meanwhile, a second insulating layer 170 can be formed above the gate electrode 160. The second insulating layer 170 can be formed to cover the active layer 120, the source electrode 140, and the drain electrode 142. In this case, the second insulating layer 170 can be a protective layer. When the OLED 200 is formed above the TFT, the second insulating layer 170 can be a planarization layer for substantially planarizing an upper surface of the TFT. The second insulating layer 170 can be formed of silicon oxide ($SiO_2$) or silicon nitride ($SiN_x$), as a single layer or multiple layers. FIG. 1 illustrates the second insulating layer 170 as a single layer. However, various alternations are possible. That is, the second insulating layer 170 can be multiple layers.

The CAP can be formed at a side of the TFT. The CAP includes the lower electrode 145 and the upper electrode 165. An insulating layer electrically separating the lower and upper electrodes 145 and 165 can be interposed between the lower electrode 145 and the upper electrode 165.

The lower electrode 145 can be formed of the same material as that of the source and drain electrodes 140 and 142 and can be formed on the same layer as the source and drain electrodes 140 and 142. Accordingly, the source and drain electrodes 140 and 142 and the lower electrode 145 can be formed by the same mask process.

Meanwhile, the lower electrode 145 can be formed directly on the buffer layer 110. In some embodiments, an auxiliary layer 125 is further formed below the lower electrode 145, as illustrated in FIG. 1. The auxiliary layer 125 can be formed of the same material as that of the active layer 120 and can be formed on the same layer as the active layer 120. That is, the auxiliary layer 125 can be formed of amorphous silicon, polycrystalline silicon, or an organic semiconductor material.

The upper electrode 165 can be formed on the same layer as the gate electrode 160 and can be formed of the same material as that of the gate electrode 160. Accordingly, the gate electrode 160 and the lower electrode 145 can be formed by the same mask process.

The first insulating layer 130 can be interposed between the lower and upper electrodes 145 and 165. Although FIG. 1 illustrates the first insulating layer 130 as a single layer, the first insulating layer 130 can have a multi-layered structure and other variations are possible. Thus, in the CAP according to the present embodiment, an electrical capacity can be increased, since the first insulating layer 130 functions as a dielectric layer and the CAP is formed as a metal-insulator-metal (MIM) CAP, in which both of the lower and upper electrodes 145 and 165 are formed of a metal.

The second insulating layer 170 can be formed on the upper electrode 165 to cover the upper electrode 165. The second insulating layer 170 can cover the TFT and the CAP to protect the TFT and the CAP and can substantially planarize the surface on which the OLED 200 is formed, as described above.

The OLED 200 having the pixel electrode 210, an opposite electrode 230 facing the pixel electrode 210, and an intermediate layer 220 interposed between the pixel electrode 210 and the opposite electrode 230 and including an emission layer, is formed on the second insulating layer 170.

There is an opening portion exposing at least one of the source and drain electrodes 140 and 142 in the second insulating layer 170. The pixel electrode 210 contacting either of the source electrode 140 and the drain electrode 142 via the opening portion to be electrically connected to the TFT is formed on the second insulating layer 170. The pixel electrode 210 can be formed as a (half) transparent electrode or a reflection electrode. When the pixel electrode 210 is formed as the (half) transparent electrode, the pixel electrode 210 can be formed of, for example, ITO, IZO, ZnO, $In_2O_3$, IGO, or AZO. When the pixel electrode 210 is formed as the reflection electrode, the pixel electrode 210 can include a reflective layer formed of Ag, Mg, Al, Pt, Pd, Au, Ni, Nd, Ir, Cr, or a combination thereof, and a layer formed of ITO, IZO, ZnO, $In_2O_3$, IGO, or AZO. However, embodiments are not limited thereto. The pixel electrode 210 can be formed of various materials and also, the structure of the pixel electrode 210 can vary. For example, the pixel electrode 210 is formed as a single layer or multiple layers.

A third insulating layer 180 can be formed on the second insulating layer 170. The third insulating layer 180 is a pixel-defining layer. The third insulating layer 180 has openings respectively corresponding to sub-pixels, that is, the openings covering an edge of the pixel electrode 210 so as to expose a central portion of each of the pixel electrode 210, so that the third insulating layer 180 can define pixels. Also, as illustrated in FIG. 1, the third insulating layer 180 increases the distance between ends of the pixel and opposite electrodes 210 and 230, thereby preventing an arc forming in the end of the pixel electrode 210. The third insulating layer 180 can be formed of, for example, an organic material, such as polyimide.

The intermediate layer 220 of the OLED 200 can be formed of a low molecular weight material or a high molecular weight material. When the intermediate layer 220 is formed of the low molecular weight material, a hole injection layer (HIL), a hole transport layer (HTL), an electron transport layer (ETL), and an electron injection layer (EIL) can be stacked below or above an emission layer (EML), as a single-layered or a multi-layered structure. Also, the intermediate layer 220 can be formed of various organic materials, such as copper phthalocyanine (CuPc), N,N'-Di(naphthalene-1-yl)-N,N'-diphenyl-benzidine (NPB), and tris-8-hydroxyquinoline aluminum (Alq3). The HIL, the HTL, the ETL, the EIL, and the EML can be formed by using a vapor deposition method.

When the intermediate layer 220 includes the high molecular weight material, the intermediate layer 220 can usually have a structure including the HTL and the EML. Here, PEDOT can be used for the HTL, and a high molecular weight material, such as poly-phenylenevinylene (PPV) and polyfluorene, can be used for the EML. Here, screen printing, inkjet printing, or laser induced thermal imaging (LITI) can be used to form the HTL and the EML. The intermediate layer 220 is not necessarily limited thereto, and can have various structures.

The opposite electrode 230 can be formed to face the pixel electrode 210 with the intermediate layer 220 including the EML between the opposite electrode 230 and the pixel electrode 210. Although it is not illustrated FIG. 1, the opposite electrode 230 can be formed throughout the substrate 100. That is, the opposite electrode 230 can be integrally formed with the OLED 200 so as to correspond to the pixel electrode 210.

The opposite electrode 230 can be formed as a (half) transparent electrode or a reflection electrode. When the opposite electrode 230 is formed as the (halt) transparent electrode, the opposite electrode 230 can have a layer formed of a metal having a high work function, such as Li, Ca, LiF/Ca, LiF/Al, Al, Ag, Mg, or a combination thereof, and a (half) transparent conductive layer, such as ITO, IZO, ZnO, or $In_2O_3$, When the opposite electrode 230 is formed as the reflection electrode, the opposite electrode 230 can have a layer formed of Li, Ca, LiF/Ca, LiF/Al, Al, Ag, Mg, or a combination thereof. The structure and the material of the opposite electrode 230 are not limited thereto, and various alterations are possible.

The TFT array substrate and the OLED display including the TFT array substrate are described. However, the described technology is not limited thereto. That is, a method of manufacturing the OLED display is also included in the scope of the described technology.

Figure 2A:
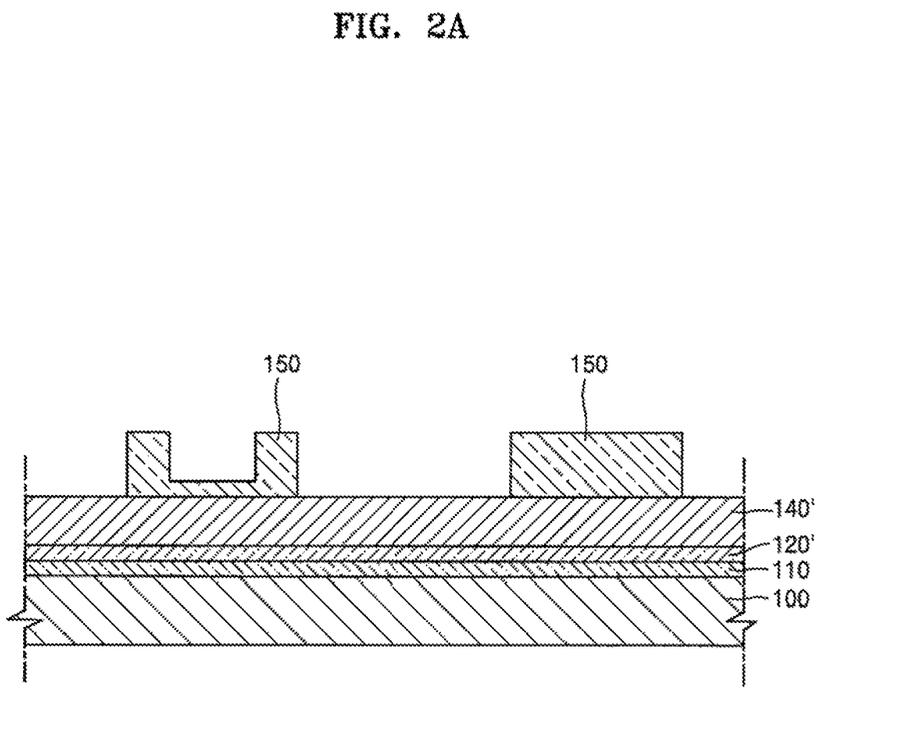
FIGS. 2A and 2B are cross-sectional views for describing a first mask process for manufacturing the OLED display of FIG. 1.
Figure 2B:
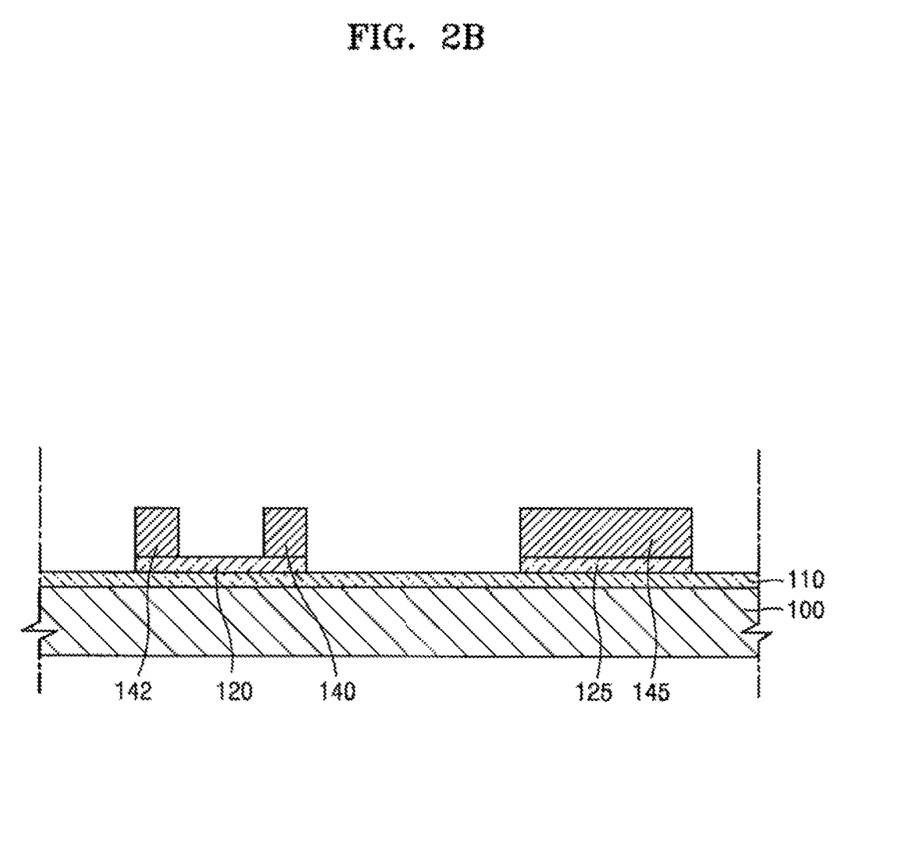

FIGS. 2A and 2B are cross-sectional views for describing a first mask process for manufacturing the OLED display of FIG. 1.

Referring to FIGS. 2A and 2B, the active layer 120, the source electrode 140, and the drain electrode 142 of the TFT can be formed by sequentially spreading a semiconductor material layer 120' and a first metal layer 140' on the substrate 100 and patterning the semiconductor material layer 120' and the first metal layer 140'. Here, before the semiconductor material layer 120' and the first metal layer 140' are formed on the substrate 100, the buffer layer 110 can be formed on the substrate 100.

As illustrated in FIG. 2A, a photoresist 150 is spread on the first metal layer 140' to pattern the semiconductor material layer 120' and the first metal layer 140', and then, the active layer 120, the source electrode 140, and the drain electrode 142 can be substantially simultaneously patterned by a photolithography process using a first mask (not shown). The patterning process of the photolithography method includes a series of processes including light exposure, development, etching, and scrip or ashing. This aspect will not be repeatedly described, when sequential mask processes are described. Through this patterning process, the active layer 120, the source electrode 140, and the drain electrode 142 can be patterned as illustrated in FIG. 2B.

As described above, the active layer 120, the source electrode 140, and the drain electrode 142 can be substantially simultaneously patterned through the first mask process. In order to substantially simultaneously pattern material layers having height differences by using one mask, a half-tone mask can be used as the first mask. Using the process using the half-tone mask, the active layer 120, the source electrode 140. and the drain electrode 142 can be integrally formed.

Here, in the first mask process, the auxiliary layer 125 and the lower electrode 145 of the CAP can be formed together with the active layer 120, the source electrode 140, and the drain electrode 142 of the TFT. Thus, the lower electrode 145 can be substantially simultaneously formed with and on the same layer as the source and drain electrodes 140 and 142. The auxiliary layer 125 can be substantially simultaneously formed with and on the same layer as the active layer 120.

Figure 3:
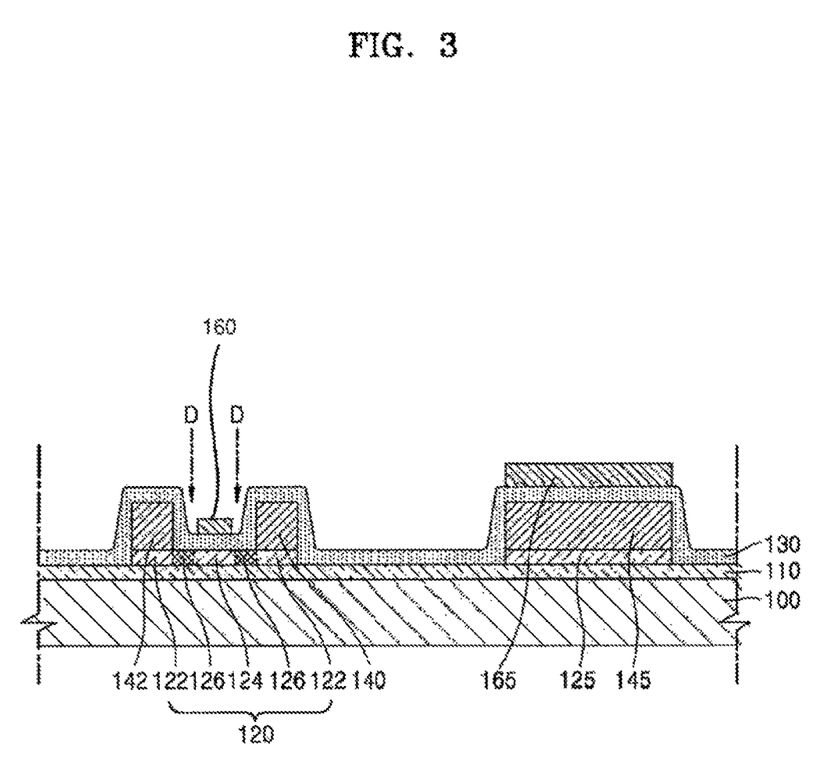
FIG. 3 is a cross-sectional view for describing a second mask process for manufacturing the OLED display of FIG. 1.

FIG. 3 is a cross-sectional view for describing a second mask process for manufacturing the OILED display of FIG. 1.

Referring to FIG. 3, the first insulating layer 130 is stacked on the active layer 120, the source electrode 140, and the drain electrode 142 to cover the active layer 120, the source electrode 140, and the drain electrode 142 of the TFT. The first insulating layer 130 can be a gate insulating layer separating the active layer 120 and the gate electrode 160.

After a second metal layer (not shown) is stacked on the first insulating layer 130, the second metal layer can be patterned to form the gate electrode 160 on a portion of the first insulating layer 130, which corresponds to the active layer 120.

Here, the upper electrode 165 can be formed on the lower electrode 145 of the CAP, substantially simultaneously with the gate electrode 160. Thus, the upper electrode 165 can be formed of the same material as that of the gate electrode 160 and can be formed substantially simultaneously with and on the same layer as the gate electrode 160. The first insulating layer 130 can be interposed between the lower and upper electrodes 145 and 165 as a dielectric layer.

The semiconductor material layer 120' can be formed of amorphous silicon, crystalline silicon, or a transparent conductive oxide semiconductor. When the semiconductor material layer 120' is formed of amorphous silicon, a process of crystallizing amorphous silicon can further be included. The method of crystallizing amorphous silicon can include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

Here, at least a portion of the active layer 120 overlaps the source electrode 140, the drain electrode 142, and the gate electrode 160. The active layer 120 can have the first to third regions 122, 124 and 126. In the first region 122, the active layer 120 can directly contact the source and drain electrodes 140 and 142. The second region 124 can be a channel region and the third region 126 can be an impurity region.

In order to form the third region 126 as the impurity region, the third region 126 can be doped in portions of the first insulating layer 130 as indicated by the letter D, after the gate electrode 160 is formed. Depending on the materials used in doping, the active layer 120 of the TFT can be an n-type semiconductor or a p-type semiconductor.

Figure 4:
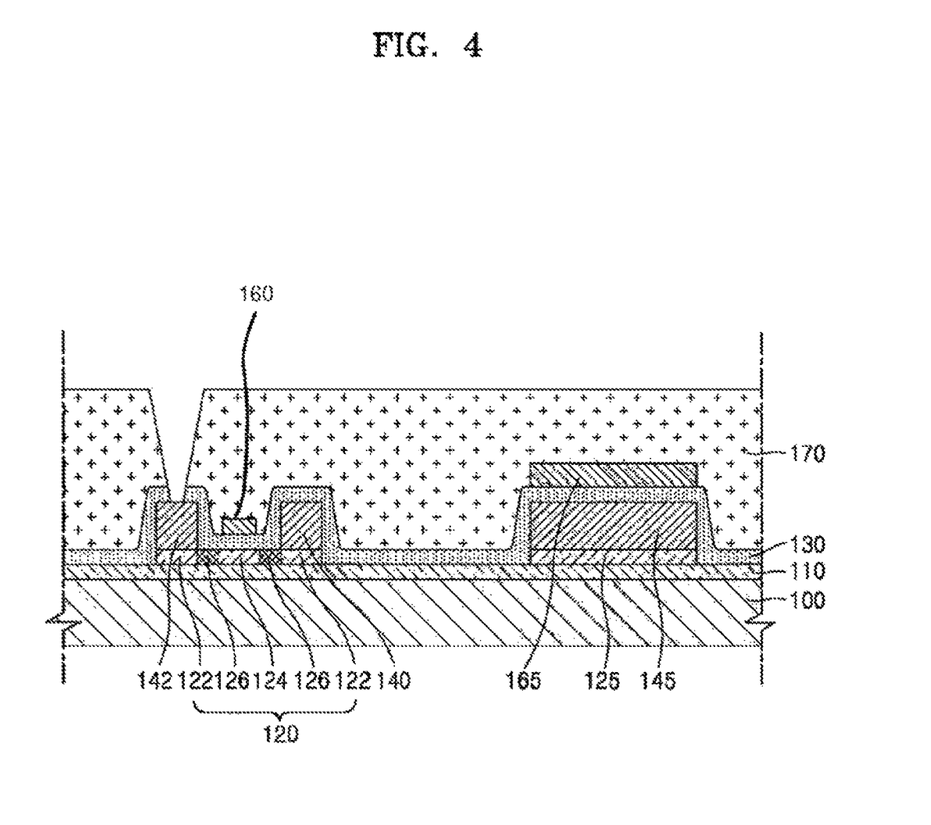
FIG. 4 is a cross-sectional view for describing a third mask process for manufacturing the OLED display of FIG. 1.
Figure 5:
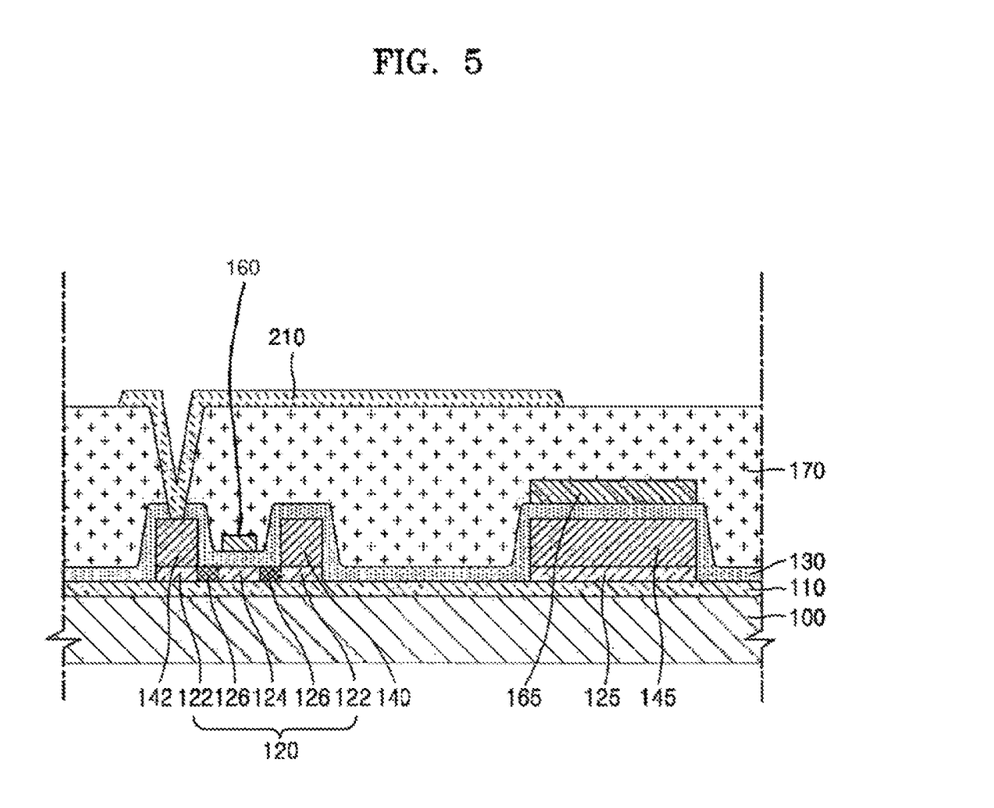
FIG. 5 is a cross-sectional view for describing a fourth mask process for manufacturing the OLED display of FIG. 1.
Figure 6:
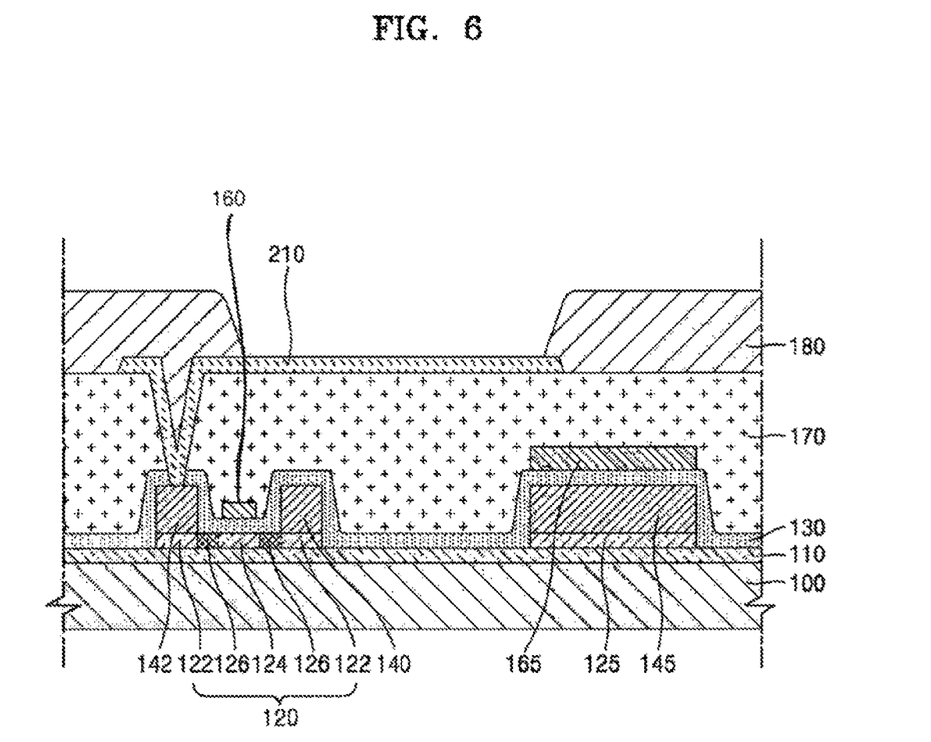
FIG. 6 is a cross-sectional view for describing a fifth mask process for manufacturing the OLED display of FIG. 1.

FIGS. 4 through 6 are cross-sectional views for describing a third mask process through a fifth mask process for manufacturing the GUM display of FIG. 1.

Referring to FIG. 4, in the third mask process, a via-hole exposing at least one of the source and drain electrodes 140 and 142 of the TFT is formed after the second insulating layer 170 is stacked on the first insulating layer 130 to cover the gate electrode 160. The second insulating layer 170 can be a protective layer protecting the TFT and the CAP or a planarization layer substantially planarizing a surface on which the OLED 200 is formed. Although FIG. 4 illustrates the second insulating layer 170 as a single layer, various alterations are possible. That is, the second insulating layer 170 can be formed as multiple layers.

Next, referring to FIG. 5, in the fourth mask process, the pixel electrode 210 which is electrically connected to one of the source and drain electrodes 140 and 142 via the via-hole can be formed, after a third metal layer (not shown) is spread on the second insulating layer 170.

Then, referring to FIG. 6, in the fifth mask process, the third insulating layer 180 exposing a central portion of the pixel electrode 210 by covering an edge of the pixel electrode 210 can be formed on the second insulating layer 170. The third insulating layer 180 can be a pixel-defining layer defining a pixel region.

Although it is not illustrated in FIG. 6, referring again to FIG. 1, the intermediate layer 220 including the EML, can be formed on the pixel electrode 210, and the opposite electrode 230 covering the intermediate layer 220 can be formed on the third insulating layer 180.

As described above, according to at least one of the disclosed embodiments, the number of masks can be reduced in a process of manufacturing the OLED display. Thus, the manufacturing process becomes simpler. Also, since the first insulating layer 130, which corresponds to a gate insulating layer, is formed between the source and drain electrodes 140 and 142 and the gate electrode 160, the CAP can have a metal/insulator/metal (MIM) structure, Which is a stable structure. In addition, since the gate electrode 160, the source and drain electrodes 140 and 142, and the pixel electrode 210 are each separately etched, wet-etching can be easily performed and there is little etch skew after etching, thereby significantly reducing resistance of wirings.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing an organic light-emitting diode (OLED) display, the method comprising:
    first forming a semiconductor material layer and a first metal layer over a substrate, wherein the first metal layer is formed over the semiconductor material layer;
    first patterning the semiconductor material layer and the first metal layer so as to form an active layer, a source electrode, and a drain electrode of a thin film transistor (TFT);
    second forming a first insulating layer including a portion corresponding to the active layer;
    third forming a second metal layer over the active layer, the source electrode and the drain electrode;
    second patterning the second metal layer so as to form a gate electrode on the portion of the first insulating layer;
    fourth forming a second insulating layer, having a via hole, over the first insulating layer so as to cover the gate electrode, wherein the via hole exposes one of the source and drain electrodes;
    fifth forming a third metal layer over the second insulating layer;
    third patterning the third metal layer so as to form a pixel electrode electrically connected to one of the source and drain electrodes through the via hole; and
    sixth forming a third insulating layer over the second insulating layer so as to cover edges of the pixel electrode and expose the remaining portion of the pixel electrode.

2. The method of claim 1, wherein the first forming and the first patterning are performed with a first mask,
    wherein the second forming, the third forming and second patterning are performed with a second mask,
    wherein the fourth forming is performed with a third mask,
    wherein the fifth forming and the fifth patterning are performed with a fourth mask, and
    wherein the sixth forming is performed with a fifth mask.

3. The method of claim 1, wherein the first forming comprises forming a lower electrode of a capacitor over the substrate.

4. The method of claim 3, wherein, in the first forming, the lower electrode of the capacitor is formed on the same layer as the source and drain electrodes, and formed substantially simultaneously as the source and drain electrodes.

5. The method of claim 1, wherein the second forming further comprises forming an upper electrode of the capacitor over the lower electrode.

6. The method of claim 5, wherein, in the second forming, the upper electrode of the capacitor is formed on the same layer as that of the gate electrode and formed substantially simultaneously as the gate electrode.

7. The method of claim 1, wherein the first forming is performed with a half-tone mask.

8. The method of claim 1, wherein the active layer, the source electrode, and the drain electrode are integrally formed.

9. The method of claim 1, wherein the active layer has a first region at least partially overlapping the source and drain electrodes, a second region at least partially overlapping the gate electrode, and a third region different from the first and second regions, and wherein the first region is formed such that the active layer directly contacts the source and drain electrodes.

10. The method of claim 9, further comprising, between the third forming and the fourth forming, forming impurities only in the third region of the active layer.

* * * * *